(12) United States Patent
Goichman et al.

(10) Patent No.: US 12,044,727 B2
(45) Date of Patent: Jul. 23, 2024

(54) PROBES FOR ELECTRICAL TESTING IN DEFECT DETECTION SYSTEMS

(71) Applicant: Orbotech Ltd., Yavne (IL)

(72) Inventors: Tal Goichman, Kiryat Ono (IL); Dmitri Burshtyn, Yavne (IL); Ashkan Aghajani, Yavne (IL)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 17/947,765

(22) Filed: Sep. 19, 2022

(65) Prior Publication Data

US 2024/0094285 A1 Mar. 21, 2024

(51) Int. Cl.
*G01R 31/28* (2006.01)

(52) U.S. Cl.
CPC .................. *G01R 31/2889* (2013.01)

(58) Field of Classification Search
CPC ...... G01R 31/2889; G01R 3/00; G01R 19/00; G01R 29/00; G01R 27/00
See application file for complete search history.

(56) References Cited

U.S. PATENT DOCUMENTS

| | | | |
|---|---|---|---|
| 5,506,515 A * | 4/1996 | Godshalk | G01R 1/06772 324/755.02 |
| 7,009,412 B2 * | 3/2006 | Chong | G01R 1/07342 324/754.14 |
| 8,222,913 B2 | 7/2012 | Lee et al. | |
| 9,000,793 B2 | 4/2015 | Cros et al. | |
| 9,366,697 B2 | 6/2016 | Weikle, II et al. | |
| 10,359,448 B2 | 7/2019 | Okada et al. | |
| 10,571,517 B1 | 2/2020 | Mardi et al. | |
| 10,962,567 B2 | 3/2021 | Yue et al. | |
| 2001/0019276 A1 * | 9/2001 | Yoshida | G01R 1/07342 324/755.01 |
| 2009/0153161 A1 * | 6/2009 | Ishikawa | G09G 3/006 324/755.01 |
| 2009/0224783 A1 | 9/2009 | Gleason et al. | |
| 2010/0244867 A1 | 9/2010 | Chong et al. | |
| 2012/0212248 A9 | 8/2012 | Chong et al. | |
| 2015/0362551 A1 * | 12/2015 | Saunders | G01R 31/2889 324/754.03 |
| 2019/0310295 A1 | 10/2019 | Osterberg et al. | |
| 2020/0241043 A1 * | 7/2020 | Shiv | G01R 1/07307 |
| 2020/0278380 A1 | 9/2020 | Osterberg et al. | |

FOREIGN PATENT DOCUMENTS

| | | |
|---|---|---|
| CN | 110531124 A | 12/2019 |
| JP | 2008281360 A | 11/2008 |
| KR | 102150940 B1 | 9/2020 |

(Continued)

OTHER PUBLICATIONS

WIPO, International Search Report for International Application No. PCT/IL2023/050973, Dec. 11, 2023.

*Primary Examiner* — Eman A Alkafawi
*Assistant Examiner* — Suresh K Rajaputra
(74) *Attorney, Agent, or Firm* — Hodgson Russ LLP

(57) ABSTRACT

A fine electrical probe can provide fine-pitch applications in devices such as smart watches and smart phones. Fingers are positioned on a substrate. The substrate has a recess that allows the fingers to flex. The substrate and fingers are positioned in an assembly. The assembly has a recess that allows the substrate to flex.

20 Claims, 8 Drawing Sheets

(56) References Cited

FOREIGN PATENT DOCUMENTS

| | | |
|---|---|---|
| KR | 102188448 B1 | 12/2020 |
| KR | 102241059 B1 | 4/2021 |
| KR | 102241061 B1 | 4/2021 |
| KR | 102265103 B1 | 6/2021 |
| KR | 102267328 B1 | 6/2021 |
| TW | 202001255 A | 1/2020 |
| WO | 2020205236 A1 | 10/2020 |
| WO | 2020222327 A1 | 11/2020 |

* cited by examiner

PROBES FOR ELECTRICAL TESTING IN DEFECT DETECTION SYSTEMS

FIELD OF THE DISCLOSURE

This disclosure relates to probes for electrical testing.

BACKGROUND OF THE DISCLOSURE

Multi-electrode probes are commonly used to determine one or more electrical parameters of a test sample. When performing such measurements, the multi-electrode probe contacts the sample surface to create electrical contact. Liquid crystal display (LCD) panels incorporate liquid crystals that exhibit electric-field dependent light modulating properties. They are used frequently to display images and other information in a variety of devices ranging from fax machines, laptop computer screens, phones, tablets, watches, and large screen, high-definition televisions. Active matrix LCD panels are complex layered structures that can include several functional layers including a polarizing film; a thin film transistor (TFT) glass substrate incorporating thin-film transistors, storage capacitors, pixel electrodes, and interconnect wiring; an orientation film made of polyimide; and the actual liquid crystal material incorporating plastic/glass spacers to maintain proper LCD cell thickness. LCD panels are manufactured under highly controlled conditions in a clean room environment to maximize yield. Nonetheless, many LCDs are discarded because of manufacturing flaws.

To improve production yield of complex electronic devices, such as LCD panels, various inspection stages are performed to identify various defects that can occur during various stages of the fabrication process. These inspection stages may be performed between the fabrication stages or after the completion of the entire fabrication process. One example of the inspection process is the testing of TFT arrays used in LCDs and OLED displays for electrical defects. Various inspection devices are used to perform the testing.

Electrical inspection systems in general require the device under test (DUT) to be driven with electrical signals, or patterns, that facilitate the detection of defects. These signals are conveyed from a pattern generator subsystem to the DUT using a structure carrying probe fingers that physically touch contact pads located at the periphery of the active area of the DUT.

Previous techniques for electrical inspection used pogo pins, which are spring preloaded plungers. These pins cannot be reduced in size below a diameter of a few hundred microns. This size does not allow scaling down pitch and size of the probes. Additionally, the pogo pins are mechanically mounted on machined plastic carrier. Plastic machining is limited in terms of precision and resolution.

Therefore, new systems and techniques are needed.

BRIEF SUMMARY OF THE DISCLOSURE

A probe is disclosed in a first embodiment. The probe includes a substrate defining a contact surface and a substrate recess at a distal end of the substrate; a plurality of fingers disposed on the contact surface; and an assembly configured to hold the substrate and the fingers. The fingers extend beyond the distal end of the substrate and across the substrate recess. The fingers are spaced apart from the substrate as the fingers extend across the substrate recess. The assembly defines an assembly recess. The substrate is spaced apart from the assembly in the assembly recess.

The fingers can be fabricated of BeCu. The substrate can be ceramic.

The assembly can define an aperture. The probe can include a limiter disposed in the aperture. The limiter is configured to extend into the assembly recess and restrict flexing of the substrate. The limiter can be fabricated of metal.

The probe can include an electrical connector in electrical communication with the plurality of fingers. The electrical connector is disposed in the assembly.

The probe can include at least one spring disposed between the substrate and the assembly in the assembly recess.

The substrate recess can extend into the substrate from the contact surface by 25 μm to 100 μm.

The fingers can extend beyond the distal end of the substrate from 50 μm to 200 μm.

Each of the fingers can have a width from 10 μm to 20 μm.

The fingers can have a thickness extending from the contact surface from 30 μm to 150 μm.

Each of the fingers can have a conical or frustoconical cross section having a first outer surface and a second outer surface opposite the first outer surface. The second outer surface is wider than the first outer surface.

A distance between the fingers and the substrate in the substrate recess can be greater than zero and less than 1 mm.

A method is provided in a second embodiment. The method includes contacting an electrical device with a probe that includes a plurality of fingers (e.g., BeCu) disposed on a substrate. The fingers are flexed within a substrate recess of the substrate. The fingers and the substrate are flexed within an assembly recess of an assembly configured to hold the fingers and the substrate. Measurements of an electrical test of the electrical device using the probe are received.

The method can include applying tension between the substrate and the assembly using at least one spring in the assembly recess disposed between the substrate and the assembly.

The fingers can be flexed from 25 μm to 100 μm across the substrate recess.

The substrate can be flexed up to 50 μm across the assembly recess.

The electrical device can be a screen or a flat panel display.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1A:
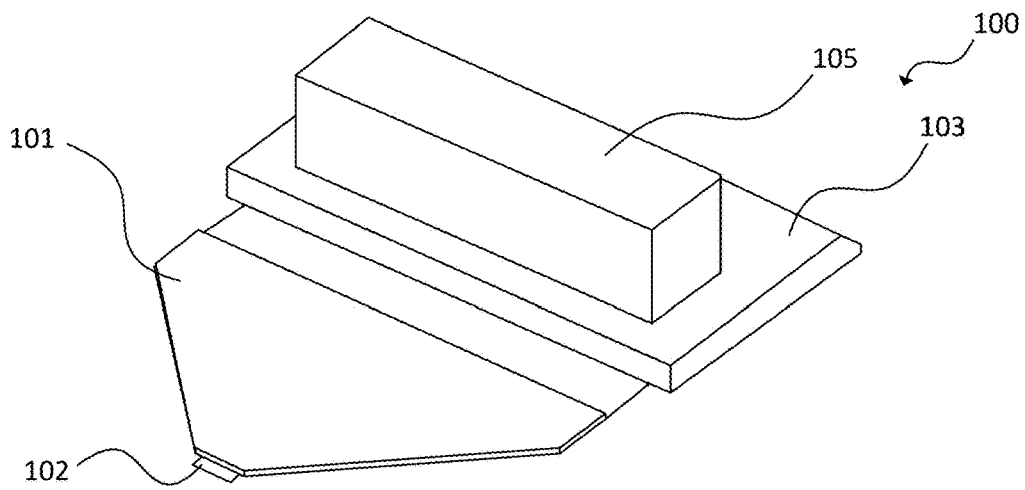
FIG. 1A shows an embodiment of a probe including the components without the assembly.
Figure 1B:
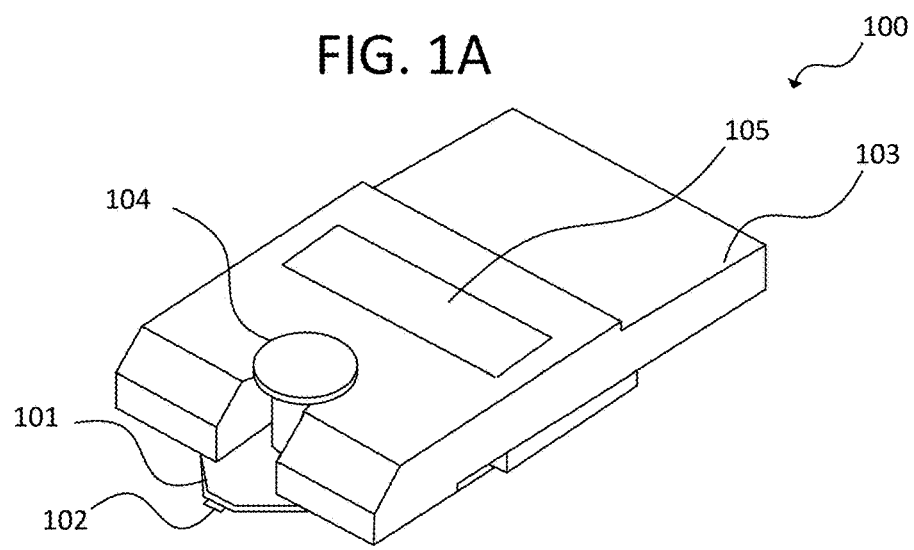
FIG. 1B shows the components with the assembly.
Figure 1C:
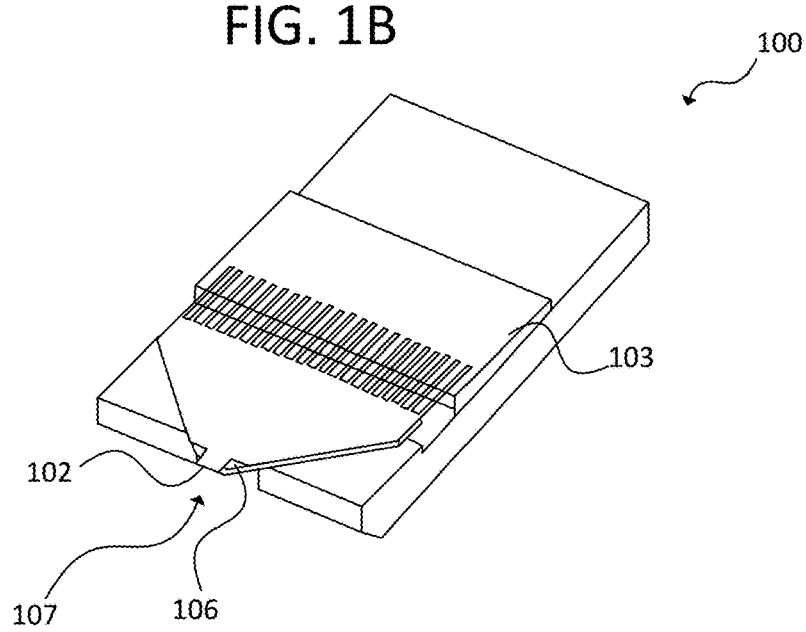
FIG. 1C shows the opposite view of the assembly in FIG. 1B.

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide fine electrical probes (e.g., 20 µm) that can enable fine-pitch electrical measurement applications for devices such as smart watches and smart phones. Smart watches, smart phones, and other screens or flat panels can benefit from probes with finer tips. The dimensions, shape, and flex of the fingers and associated components enable improved precision and resolution compared to previous designs.

FIGS. 1A-1C and FIGS. 2A-2D show an embodiment of a probe 100. The probe 100 includes a substrate 101 that defines a contact surface 106 and a substrate recess 107 at a distal end 107 of the substrate 101. The substrate 101 can be fabricated of a ceramic, such as $Al_2O_3$, AlN, BeO, glass, silica, or other insulating materials.

Fingers 102 are disposed on the contact surface 106 of the substrate 101. The fingers 102 extend beyond the distal end 111 of the substrate 101 and across the substrate recess 107. The fingers 102 are spaced apart from the substrate 101 as the fingers 102 extend across the substrate recess 107.

In an instance, the fingers 102 are fabricated of BeCu. BeCu provides improved performance with respect to fatigue, wear resistance, and solderability. The fingers 102 can be fabricated of other materials, such as a high-hardness steel coated with electroless nickel.

Figure 5:
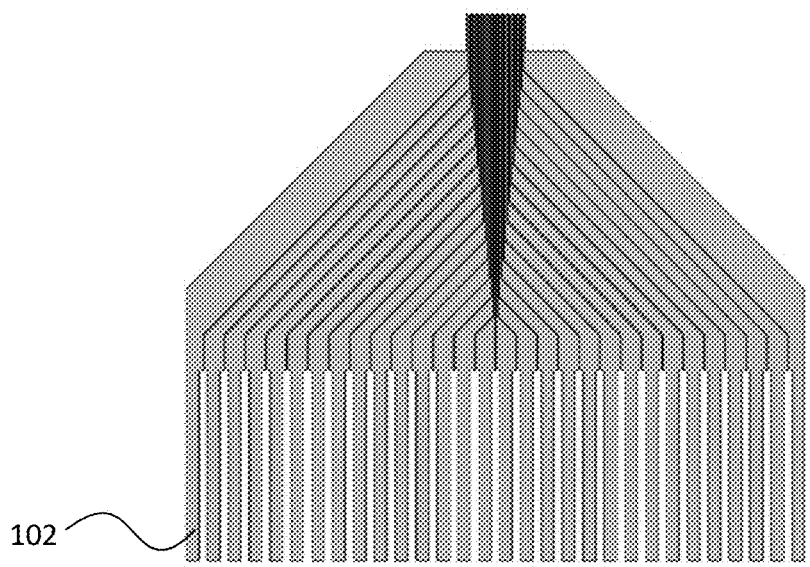
FIG. 5 is an embodiment of the fingers.

The fingers 102 can be femto-laser machined or chemically etched. In an instance, a 50-100 µm thick BeCu foil is used to form multiple fingers 102 each having a width of 10 µm or more and a length of a few hundred µm. The fingers 102 can extend into a fan, increasing their width as they extend, as shown in FIG. 5.

Figure 4:
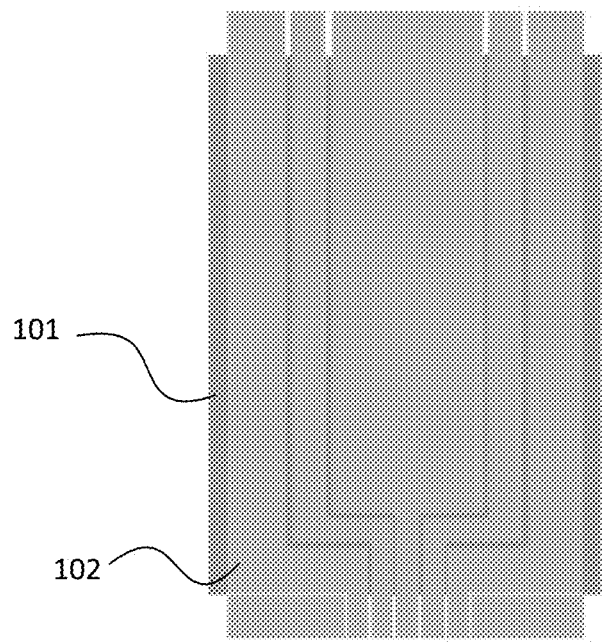
FIG. 4 is an embodiment of the fingers cut from foil on the substrate.

In an instance, the fingers 102 are glued to the substrate 101 prior to micromachining. FIG. 4 shows the fingers 102 being formed. Some of the foil was already removed in FIG. 4. The glued and micromachined sandwich including the fingers 102 and substrate 101 has protruding fine fingers 102 on one end and the same number of wider pads on the other end of substrate 101. These pads can be used as part of an electrical connection.

Figure 2A:
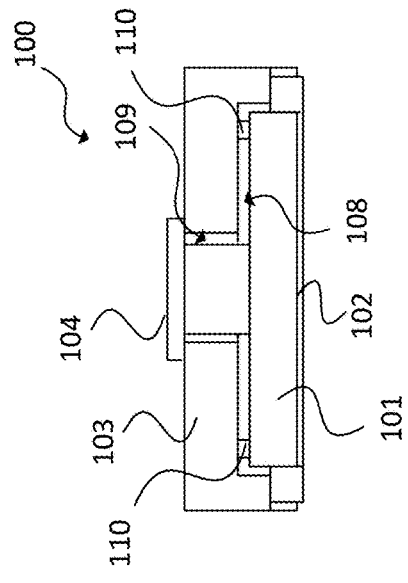
FIG. 2A is a side cross-sectional view of an embodiment of the probe.
Figure 2B:
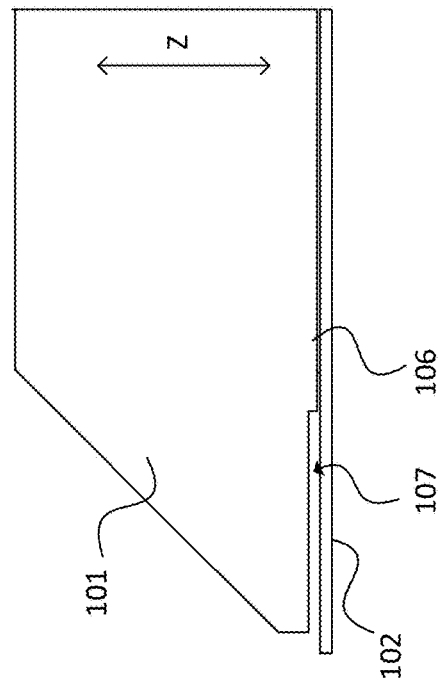
FIG. 2B is a front view of the probe in FIG. 2A.
Figure 2C:
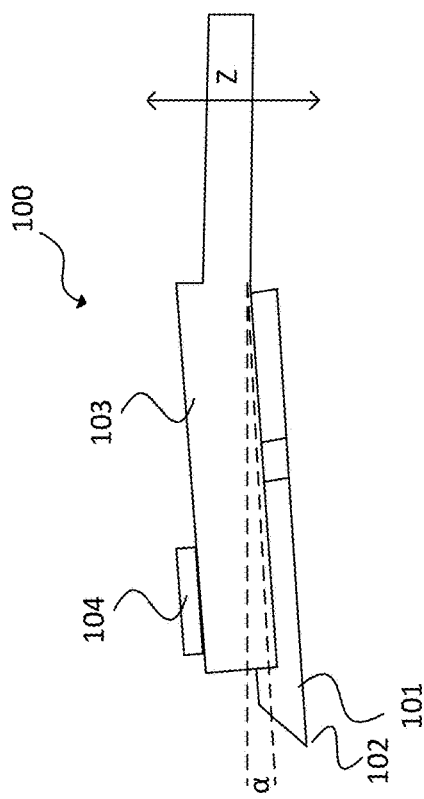
FIG. 2C is a top perspective view of the probe of FIG. 2A.
Figure 2D:
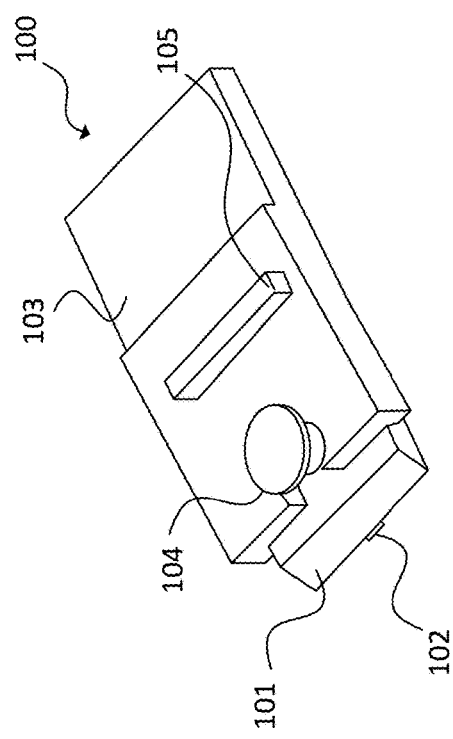
FIG. 2D is a cross-sectional view of the fingers and substrate of the probe in FIG. 2A.

An assembly 103 is configured to hold the substrate 101 and fingers 102. The assembly 103 defines an assembly recess 108. The substrate 101 is spaced apart from the assembly 103 in the assembly recess 108. The assembly recess can have a depth configured to allow angular deflection of the substrate 101 from 3° to 5° or from 3° to 7°. The substrate 101 can be positioned in the assembly recess 108 at a downward manner from the assembly 103 by this diving angle, which is shown in FIG. 2A. The distance between the substrate 101 and the assembly 103 in the assembly recess 108 can be nearly zero or even zero when the fingers 102 are pressed during testing.

The substrate 101 can be soldered to the electrical connector 105, which can be connected to the assembly 103. For example, the substrate 101 and electrical connector 105 can be bolted to the assembly 103. The substrate 101 can include the fingers 102 when it is connected to the assembly 103.

In an instance, the assembly 103 can be fabricated of anodized aluminum, though other materials are possible. The anodized aluminum can be 6061-T6 aluminum.

The assembly 103 can define an aperture 109 through its body. The aperture 109 can extend to the assembly recess 108 from an upper surface of the assembly 103. A limiter 104 can be disposed in the aperture 109. The limiter 104 is configured to extend into the assembly recess 108 and restrict flexing of the substrate 102. The limiter 104 can prevent excessive deflection of the substrate 101 and fingers 102.

The limiter 104 can be fabricated of metal, ceramic, or plastic. The limiter 104 is connected with the assembly 103, such as by gluing, soldering, or securing the components mechanically.

An electrical connector 105 can be in electrical communication with the fingers 102. The electrical connector 105 can be disposed in the assembly 103. In an instance, the fingers 102 can be soldered to a printed circuit board (PCB) serving as the electrical connector 105 that electrically connects the probe sandwich (i.e., fingers 102 and substrate 101) to the measurement tool. A hot bar technique can be used for the soldering.

Flexing travel can correlate to maximum stress in the fingers 102. The connection between the fingers 102 and the electrical connector 105 can be configured to operate while at the maximum stress of the fingers 102. The fingers 102 can break or bend if extended beyond the maximum stress.

The contacts connecting between the PCB in the electrical connector 105 and the sandwich (i.e., fingers 102 and substrate 101) also can act as flexures allowing deflection of the sandwich in the Z-direction (see FIGS. 2A and 2D) of about 1000 µm. For example, see the diving angle α in FIG. 2A.

At least one spring 110 can be used in the probe 100. In an embodiment, two springs 110 are disposed between the substrate 102 and the assembly 103 in the assembly recess 108. The at least one spring 110 creates a preload on the deflected sandwich (i.e., fingers 102 and substrate 101), which can ensure a predefined probing force and also providing the desired contact resistance. The springs 110 can have a force from 0.1 to 0.3 N, though other values are possible.

In an instance, the substrate recess 107 extends into the substrate 101 from the contact surface 106 by a depth from 25 µm to 100 µm. For example, a depth from 50 µm to 100 µm may be used. In an instance, a distance between a surface of the fingers 102 and an opposite surface of the substrate 101 in the substrate recess 107 is greater than zero and less than 1 mm. This can refer to when the fingers are not flexed.

Figure 3:
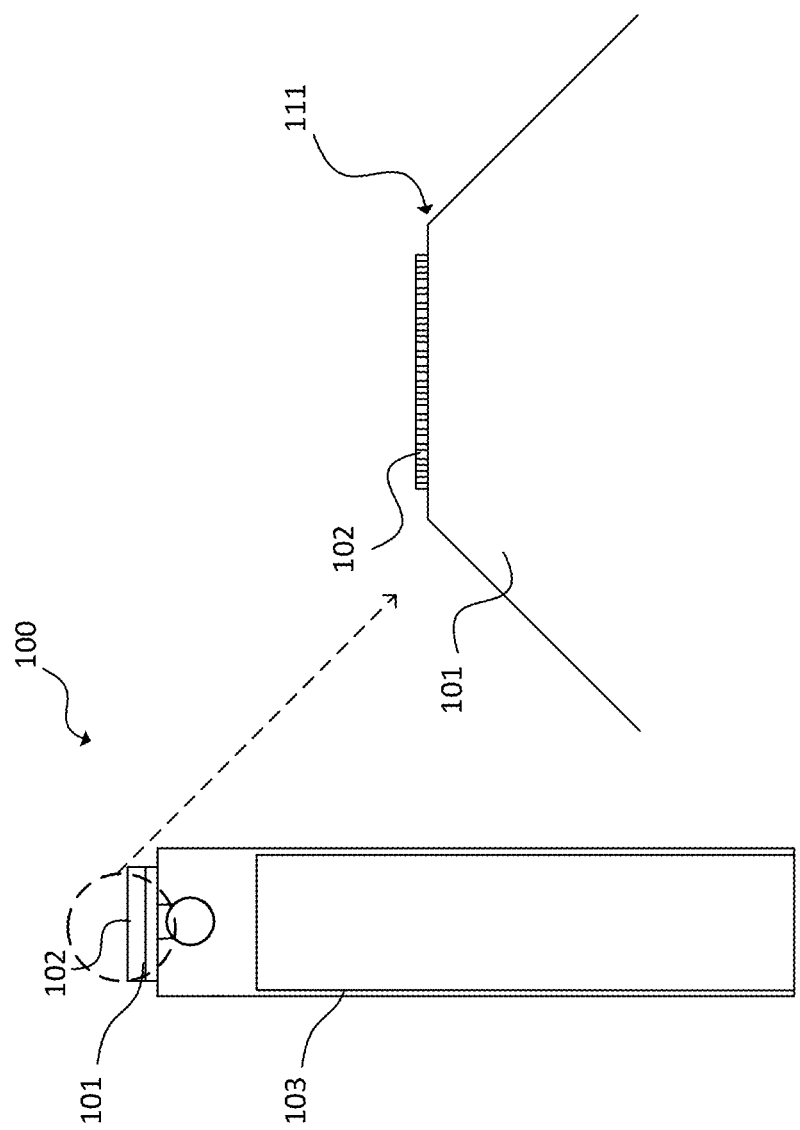
FIG. 3 is a top view of the fingers extending beyond the substrate.

FIG. 3 is a top view of the fingers 102 extending beyond the substrate 101. The fingers 102 can extend beyond the distal end 107 of the substrate 101 from 50 µm to 200 µm. In an instance, the fingers 102 extend beyond the distal end 107 of the substrate 101 by approximately 100 µm. The final width of the individual fingers 102 that contact an electrical device can be from 15 to 50 µm.

Figure 6:
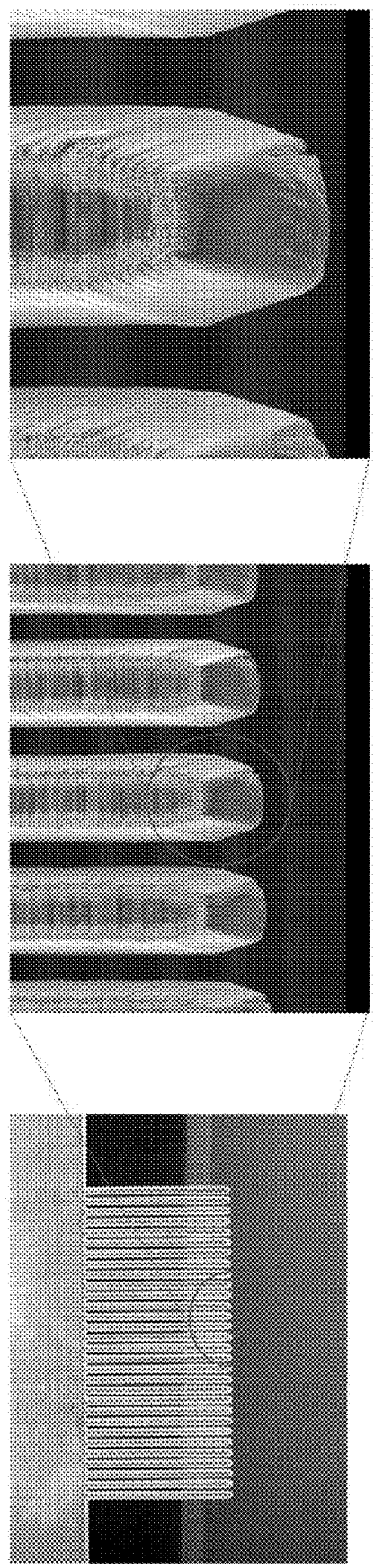
FIG. 6 shows the fingers under increasing magnification.

FIG. 6 shows the fingers 102 under increasing magnification. Each of the fingers 102 can have a width from 10 μm to 300 μm. For example, the width can be from 10 μm to 20 μm. Each of the fingers can have a height (e.g., a thickness extending from the contact surface 106) from 30 μm to 150 μm. The geometry of the fingers 102 can be adjusted depending on the height and width to accommodate the stresses, deflection, and lifetime of the fingers. This can reduce the likelihood of breakage.

There can be two areas of deflection for the fingers 102. First, the fine fingers 102 may be limited to 50 μm to 100 μm deflection by the position in the in substrate recess 107. Second, the part of the fingers 102 connected to the electrical connector 105 can limit deflection 20 using the assembly 103 and limiter 104. The part of the fingers 102 connected to the electrical connector 105 can move from 500 μm to 1000 μm. The part of the fingers 102 extending beyond the distal end 111 of the substrate 101 can deflect by approximately 200 μm.

As shown in FIG. 6, each of the fingers 102 has a conical or frustoconical cross-section having a first outer surface and a second outer surface opposite the first outer surface. The second outer surface (i.e., the bottom in FIG. 6) is wider than the first outer surface (i.e., the top in FIG. 6).

Laser machining typically produces a conical shape in the fingers 102 because of its optical numerical aperture (N/A). The tip width of the fingers 102 can be small enough to touch the pad of the device. The whole finger 102 can be as wide as possible within an allowable pitch to avoid sideways movement, which is at least partly provided by the tapering shape.

Figure 7:
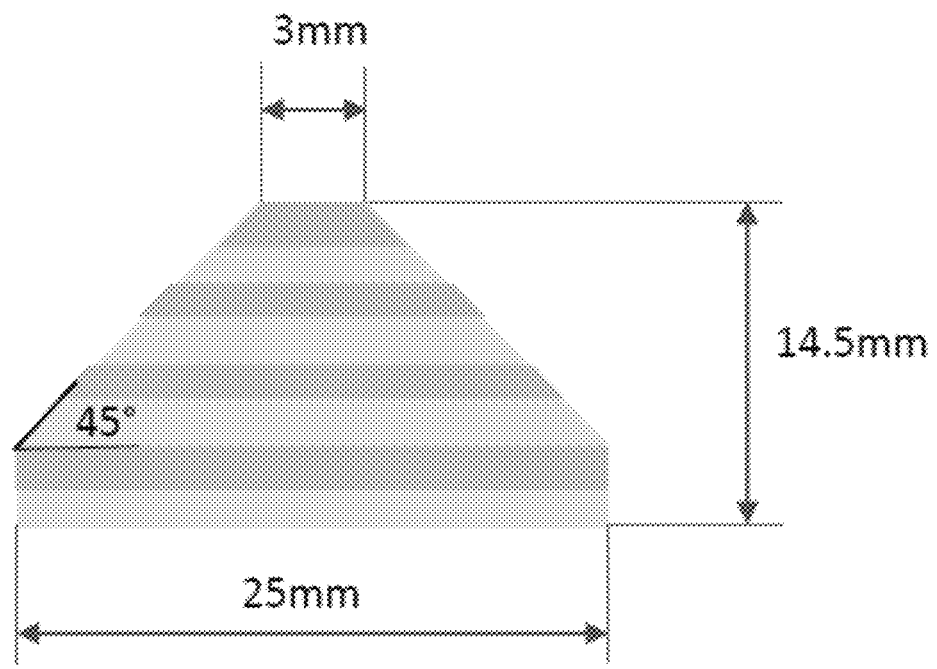
FIG. 7 shows a top view of an embodiment of the substrate.

FIG. 7 shows a top view of an embodiment of the substrate 101. The angle from the rectangular portion of the substrate 101 can be approximately 45°. The width of the distal end of the substrate where the fingers extend can be from 2 mm to 5 mm wide. The substrate 101 may have a similar shape to the fanout foil, which can reduce weight.

Figure 8:
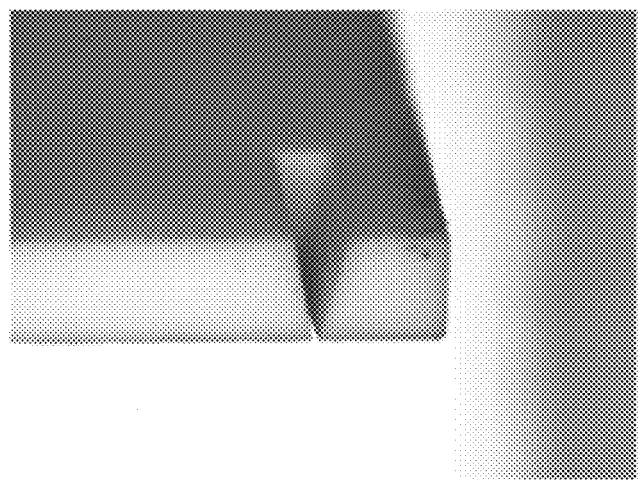
FIG. 8 is a view of the pocket in the substrate.

FIG. 8 is a view of the pocket in the substrate. Each finger may be positioned opposite a pocket that is machined into the substrate. One or more micromachined ("sculpted") pockets in the substrate 101 can limit local deflection of the fingers 102. The pocket can act like a barrier that does not allow fingers 102 to deflect after contact with inspected glass. The sculpted pockets can limit the deflection up to 50 μm for the 1000 μm protruding fingers 102.

While FIG. 8 shows individual pockets, a single recess across the width of the fingers also can be used.

Embodiments disclosed herein provide improved finger size for the probe. Different geometries than existing pogo pins are possible. Lifetime and contact resistance can be configured by controlling contact force. In an instance, embodiments of the probe disclosed herein can be a consumable part that is replaceable in the field.

Micro-machined fine finger probes provide an advantage over previous designs. A single piece of foil can be used to form the fingers, which can provide fine fingers with a distribution pattern from the fingers to flexures and/or contact with a PCB. The fingers also can provide flexing and a PCB contact. Overall ceramic motion on flexures can be mechanically (adjustably) limited to 500 μm at preloaded force, which determines contact resistance. Lowering the probe block further does not apply additional force to the fingers.

Figure 9:
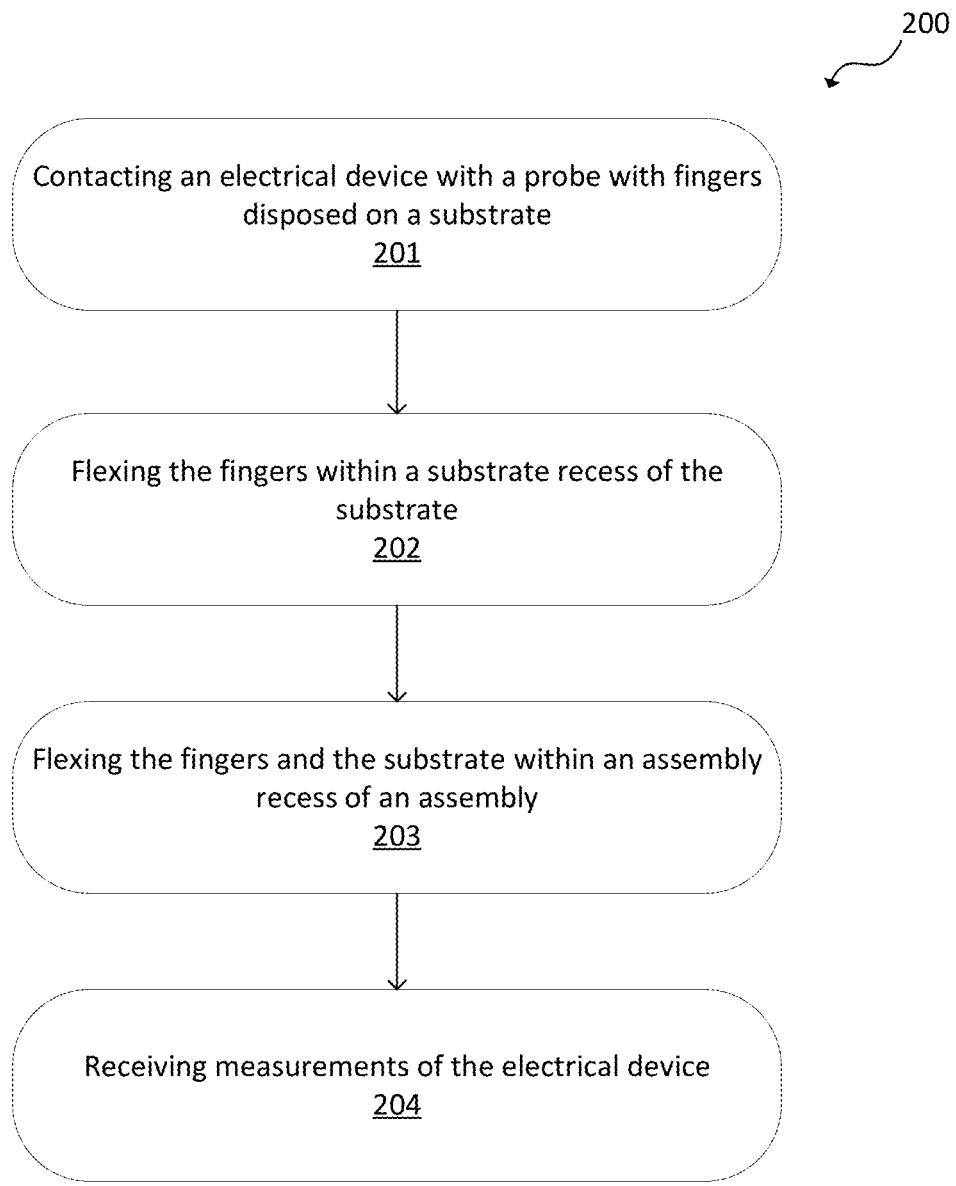
FIG. 9 is a flowchart of an embodiment of a method in accordance with the present disclosure.

FIG. 9 is a flowchart of an embodiment of a method 200, which can use an embodiment of the probe 100. At 201, an electrical device is contacted with a probe that includes multiple fingers disposed on a substrate. The electrical device can be, for example, a screen or flat panel display. The fingers can be BeCu. At least one probe is mounted on a tool platform. The tool platform can include a beam that travels over the electrical device and can move closer and farther from a surface of the electrical device to create contact. When lowered, the fingers of the probe contact conductors on the electrical device, which provides an electric field for inspection.

At 202 the fingers are flexed within a substrate recess of the substrate. At 203, the fingers and the substrate are flexed within an assembly recess of an assembly configured to hold the fingers and the substrate. Steps 202 and 203 can occur in either order or at least partially simultaneously. The fingers can be flexed from 25 μm to 100 μm across the substrate recess. The substrate can be flexed up to 50 μm across the assembly recess.

In an instance, the fingers 102 can deflect up to 100 μm (all or individually to adapt to relief). The substrate 102 can deflect from 500 μm to 1000 μm as one piece to allow for tool imprecision.

Measurements of an electrical test of the electrical device is received using the probe at 204. The measurements may be received by a processor for analysis. The processor may be part of a computer or another system.

Tension can be applied between the substrate and the assembly using at least one spring disposed between the substrate and the assembly in the assembly recess.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A probe comprising:
a substrate defining a contact surface and a substrate recess at a distal end of the substrate, wherein the substrate is planar between the distal end and an opposite proximal end;
a plurality of fingers disposed on the contact surface, wherein the fingers extend beyond the distal end of the substrate and across the substrate recess, and wherein the fingers are spaced apart from the substrate as the fingers extend across the substrate recess; and
an assembly configured to hold the substrate and the fingers, wherein the assembly defines an assembly recess that surrounds less than an entirety of the substrate, and wherein the substrate is positioned in the assembly recess at a downward angle from the proximal end of the substrate whereby the substrate is spaced apart from the assembly in the assembly recess.

2. The probe of claim 1, wherein the fingers are fabricated of BeCu.

3. The probe of claim 1, wherein the substrate is ceramic.

4. The probe of claim 1, wherein the assembly defines an aperture and further comprises a limiter disposed in the aperture, wherein the limiter is configured to extend into the assembly recess and restrict flexing of the substrate through contact with the substrate.

5. The probe of claim 4, wherein the limiter is fabricated of metal.

6. The probe of claim 1, further comprising an electrical connector in electrical communication with the plurality of fingers, wherein the electrical connector is disposed in the assembly.

7. The probe of claim 1, further comprising at least one spring disposed between the substrate and the assembly in the assembly recess.

8. The probe of claim 1, wherein the substrate recess extends into the substrate from the contact surface by 25 μm to 100 μm.

9. The probe of claim 1, wherein the fingers extend beyond the distal end of the substrate from 50 μm to 200 μm.

10. The probe of claim 1, wherein each of the fingers has a width from 10 μm to 20 μm.

11. The probe of claim 1, wherein the fingers each have a thickness extending from the contact surface from 30 μm to 150 μm.

12. The probe of claim 1, wherein each of the fingers has a conical or frustoconical cross section having a first outer surface and a second outer surface opposite the first outer surface, wherein the second outer surface is wider than the first outer surface.

13. The probe of claim 1, wherein a distance between the fingers and the substrate in the substrate recess is greater than zero and less than 1 mm.

14. A method comprising:
contacting an electrical device with a probe that includes a plurality of fingers disposed on a substrate;
flexing the fingers within a substrate recess of the substrate;
flexing the fingers and the substrate within an assembly recess of an assembly configured to hold the fingers and the substrate, wherein the assembly surrounds less than an entirety of the substrate, wherein the substrate is positioned in the assembly recess at a downward angle from an end of the substrate opposite the fingers, and wherein the substrate is planar between an end with the fingers and the end opposite the fingers prior to the flexing; and
receiving measurements of an electrical test of the electrical device using the probe.

15. The method of claim 14, wherein the fingers are fabricated of BeCu.

16. The method of claim 14, further comprising applying tension between the substrate and the assembly using at least one spring in the assembly recess disposed between the substrate and the assembly.

17. The method of claim 14, wherein the fingers are flexed from 25 μm to 100 μm across the substrate recess.

18. The method of claim 14, wherein the substrate is flexed up to 50 μm across the assembly recess.

19. The method of claim 14, wherein the electrical device is a screen.

20. The method of claim 14, wherein the electrical device is a flat panel display.

* * * * *